United States Patent [19]
Saito et al.

[11] Patent Number: 4,814,639
[45] Date of Patent: Mar. 21, 1989

[54] SUPER INTEGRATION CIRCUIT DEVICE HAVING A PLURALITY OF IC-CHIP EQUIVALENT REGIONS FORMED ON A SINGLE SEMICONDUCTOR SUBSTRATE

[75] Inventors: Tomotaka Saito; Hiroaki Murakami, both of Yokohama; Yuhji Fukushima, Tokyo; Masami Konishi, Yokohama, all of Japan

[73] Assignee: Kabushiki Kaisha Toshiba, Kawasaki, Japan

[21] Appl. No.: 238,998

[22] Filed: Aug. 29, 1988

Related U.S. Application Data

[63] Continuation of Ser. No. 860,435, May 7, 1986, abandoned.

[30] Foreign Application Priority Data

May 15, 1985 [JP] Japan .................................. 60-103320

[51] Int. Cl.⁴ .......................... H03K 3/26; H03K 17/56
[52] U.S. Cl. ..................................... 307/303; 307/243; 328/104; 357/40

[58] Field of Search ...................... 307/303, 241, 243; 357/40, 45; 328/103, 104

[56] References Cited

FOREIGN PATENT DOCUMENTS 0008002 7/1979 European Pat. Off. .

OTHER PUBLICATIONS

Koehler, "Designing a Microcontroller 'Supercell' For Testability," VLSI Design pp. 44-46, Oct. 1983.

Primary Examiner—Stanley D. Miller
Assistant Examiner—Richard Roseen
Attorney, Agent, or Firm—Finnegan, Henderson, Farabow, Garrett & Dunner

[57] ABSTRACT

At least first and second IC-chip equivalent regions having functions available from conventional one-chip IC device are formed on a single semiconductor substrate. An output of the second region is supplied to an input terminal of the first region. The output of the second region is also delivered at an external terminal in response to a test signal through a multiplexer or a bidirectional buffer.

7 Claims, 5 Drawing Sheets

F I G. 6
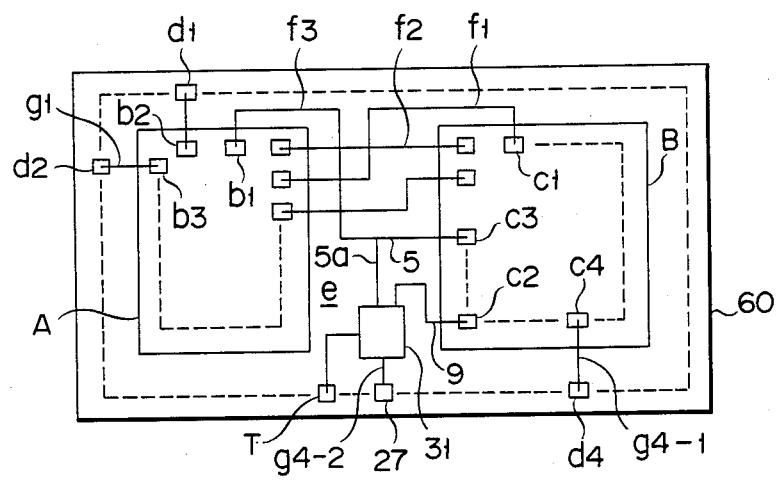

SUPER INTEGRATION CIRCUIT DEVICE HAVING A PLURALITY OF IC-CHIP EQUIVALENT REGIONS FORMED ON A SINGLE SEMICONDUCTOR SUBSTRATE

This application is a continuation of application Ser. No. 860,435, filed May 7, 1986 now abandoned.

BACKGROUND OF THE INVENTION

The present invention relates to a super integration circuit device having a plurality of IC-chip equivalent regions, each normally available as a one-chip IC device on a single semiconductor substrate.

The expression "IC-chip equivalent region" is used in the specification to describe an integrated circuit pattern which was initially developed to be manufactured as a single integrated circuit on a chip, but which is now formed as one part of a large scale integrated (LSI) device located on a single semiconductor substrate. This is explained in the specification and the terminology is used consistently throughout the specification to describe such a pattern. The "IC-chip equivalent region" is also called a super macro-cell (abbreviated as SMC hereinafter) in this specification.

Along with the recent development of LSI technology, the number of transistors formed on a single semiconductor chip has remarkably increased. Strong demand has arisen for providing one chip consisting of a plurality of LSIs arranged as an electronic equipment, so as to reduce the cost of the electronic equipment and improve its reliability. There has been proposed an effective technology to produce one chip integration including a plurality of large function blocks corresponding to LSI parts (U.S. Ser. No. 613,302). The assignee of that application is also the assignee of the present application. A typical example is illustrated in FIG. 1. Referring to FIG. 1, on a semiconductor substrate or chip I, IC-chip equivalent regions or SMCs A and B are formed together. These regions A and B have been evaluated as discrete IC chips. Since a plurality of SMCs are integrated on the single semiconductor chip I, which serves as a large scale integrated (LSI) circuit, it is called a super integration (abbreviated as SI hereinafter). Bonding pads b1, b2, ... and c1, c2, ... are formed at periphery portions of IC-chips which are now used as IC-chip equivalent regions A and B, respectively; and bonding pads d1, d2, ... are formed at periphery portion of chip I. The evaluated regions A and B are separated by appropriate space e, on the semiconductor chip I. Space e corresponds to a routing region to which interconnections f1, f2, ... between regions A and B are allocated. Another routing region is formed near the peripheral portion of chip I, and is used for providing interconnections g1, g2, g3, g4, ... to bonding pads d1, d2, d3, ... These pads d1, d2, ... are used as lead terminals of one-chip SI, so as to connect the lead terminals d1, d2, ... to an external circuit.

A conventional test technique (B. Koehler, "Designing a Microcontroller "Supercell" for Testability", VLSI DESIGN, Oct. 1983, pp. 44–46) is proposed to test a one-chip VLSI obtained by integrating SMCs (IC-chip equivalent regions). According to this technique, an SMC being tested is set completely independent of other SMCs using an I/O terminal, and is directly accessed from an external terminal during the test. The SMCs shown in FIG. 2 can be individually tested. FIG. 2 shows a circuit constructed by the inventors by using the concept of the above-mentioned conventional test technique. In the figure, portions corresponding to those of FIG. 1 are denoted by the same or corresponding reference numerals. Referring to FIG. 2, reference numeral A denotes a developed and evaluated SMC exemplified by a microprocessor. Reference numeral B denotes a circuit portion additionally developed to be used in standard cells or the like and referred to as a random section. Random section B also functions as an SMC. Reference numeral 1 denotes a bidirectional address bus; 2, a bidirectional data bus; 3 to 5, unidirectional control buses; 6, an output bus; and 7, an input bus.

SMC A includes address bus buffer 11, data bus buffer 12, control bus buffer 13, and an ALU (not shown). Buffer 13 consists of input and output sections. Section B comprises address bus buffer 21, data bus buffer 22, control bus buffer 23, output buffer 24, input buffer 25, and other circuits (not shown). Buffer 11 is a 3-state buffer connected to bus 1. Buffer 12 is an input/output buffer connected to bus 2. An output from buffer 23 in section B is supplied to the input section of buffer 13 through bus 5. An external direct signal is supplied to the input section in buffer 13 through bus 3. Buffer 13 directly outputs a signal onto bus 4. A signal from buffer 13 is also supplied to the input section of buffer 23 in section B through bus 4. An external signal is supplied to buffer 25 through wirings or bus g4. Buffer 24 directly outputs a signal onto wirings or bus g3. Buffer 21 consists of input and output sections. A signal from bus 1 is supplied to the input section in buffer 21. The output section of buffer 21 is a 3-state buffer. An output from this 3-state buffer is sent onto bus 1. Bus buffer 22 comprises an input/output buffer connected to bus 2. A test signal is supplied to both sections A and B.

The arrangement in FIG. 2 is designed as follows: when a test signal is supplied to sections A and B, (I) an output from buffer 21 is set inactive in response to the test signal; (II) buffer 22 is set inactive in response to the test signal; and (III) if signals from the output section in buffer 13 include one which is not directly output, the indirect output is conducted to buffer 24 in response to the test signal so that the indirect output can be output from the buffer 24. At the same time, the signal input to the input section in buffer 13 is directly supplied thereto from external input buffer 25 in response to the test signal. In this case, when the test signal is set active, SMC A is completely disconnected from section B. All buffers in SMC A can be externally accessed in a direct manner. More specifically, an existing test program for SMCs can be used without modifications.

However, the signal input from section B to the input section in buffer 13 in SMC A through bus 5 cannot be directly monitored at an external tester. Therefore, a means for detecting waveforms and propagation delay time of the signals appearing on bus 5 is limited to simulation. The SMC test program, simulation process data, and the simulation program are not released to general users. It is, therefore, very difficult for the users to evaluate either individual SMCs or the entire LSI made of SMCs.

SUMMARY OF THE INVENTION

It is an object of the present invention to provide a super integration circuit device capable of effectively testing signals input to a plurality of IC-chip equivalent regions or SMCs formed on a single semiconductor substrate.

According to the present invention, there is provided a super integration circuit device comprising: a single semiconductor substrate; at least first and second IC-chip equivalent regions formed on the single semiconductor substrate, each region having input and output terminals; means for supplying an output signal from the second IC-chip equivalent region to the input terminal of the first IC-chip equivalent region; means, responsive to an external signal, for extracting the output signal supplied to the input terminal of the first IC-chip equivalent region; and an external terminal for receiving an extracted output signal.

BRIEF DESCRIPTION OF THE DRAWINGS

FIG. 6 is a plan view showing the device of FIG. 5.

DETAILED DESCRIPTION OF THE PREFERRED EMBODIMENTS

Figure 2:
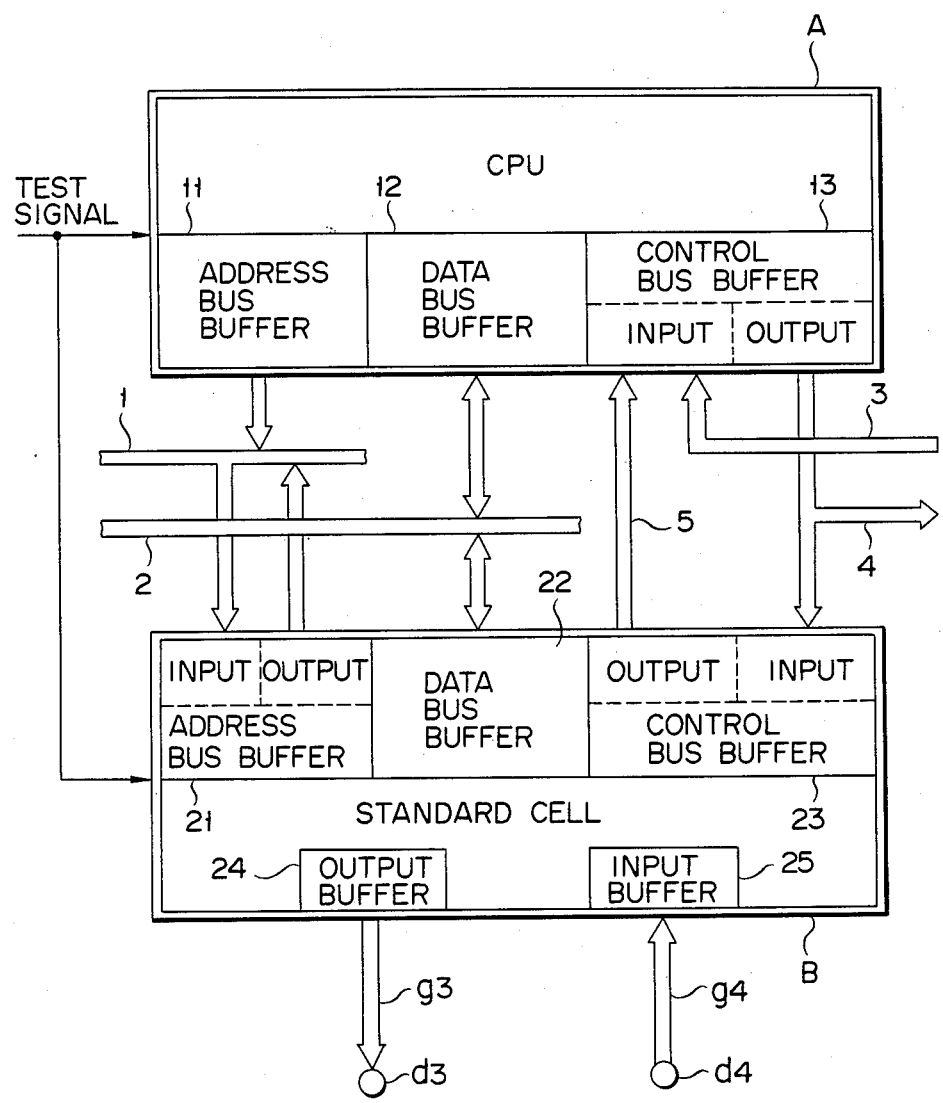
FIG. 2 is a block diagram of an example of an LSI device.
Figure 3:
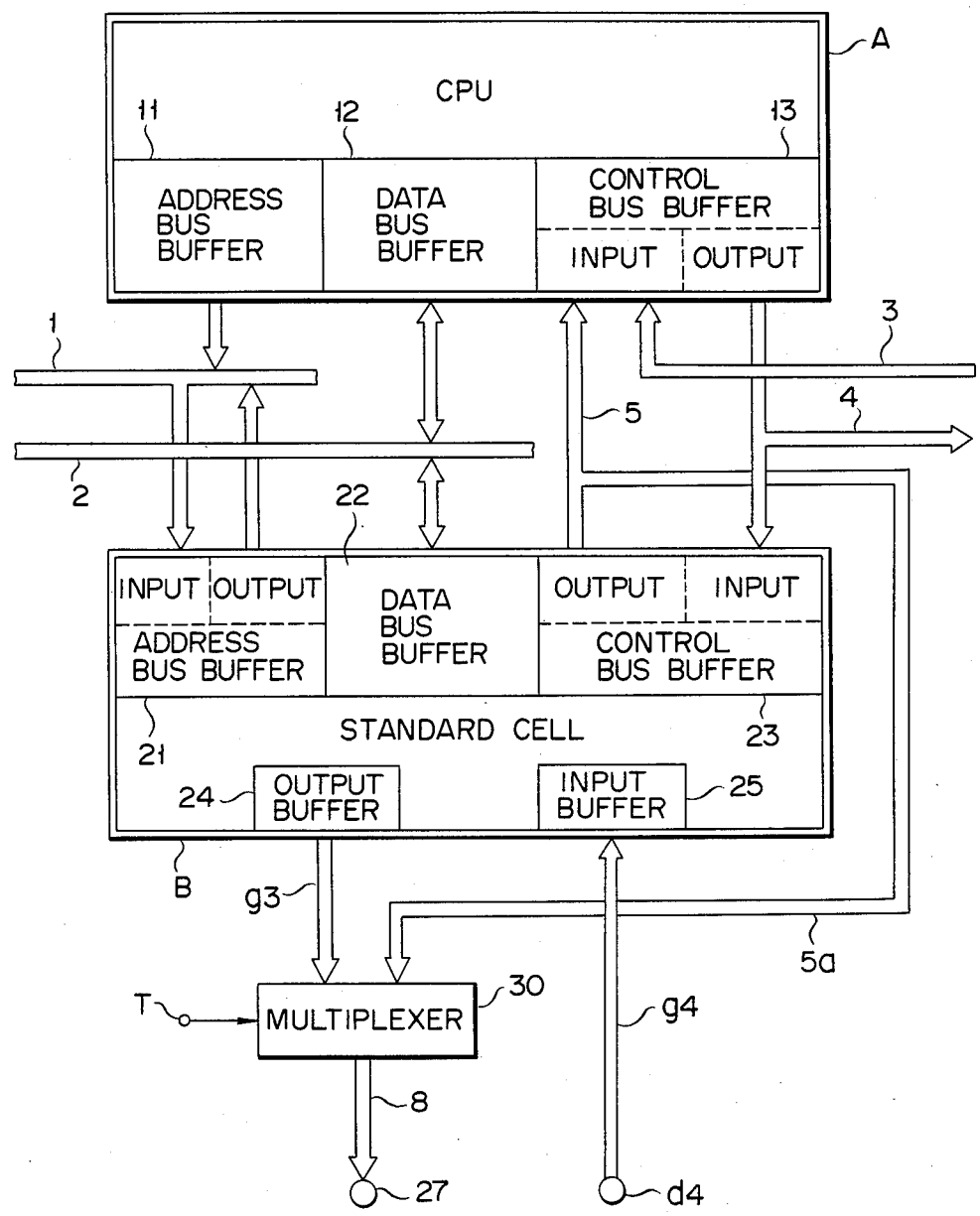
FIG. 3 is a block diagram of a super integration circuit device according to an embodiment of the present invention.

Preferred embodiments of the present invention will be described with reference to the accompanying drawings. FIG. 3 is a block diagram of a super integration circuit device according to an embodiment of the present invention. The same reference numerals in FIG. 3 denote the same parts as in FIG. 2, and a detailed description thereof will be omitted. The description will be concentrated on the main feature of the present invention. In this embodiment, multiplexer 30 is added to the arrangement in FIG. 2. An output from output buffer 24 is supplied to multiplexer 30 through output bus g3. At the same time, an output from control bus buffer 23 in random section B is supplied to the input section in control buffer 13 through bus 5. The output of buffer 23 is also multiplexed at multiplexer 30 in response to a test signal input to terminal T of multiplexer 30. An output from multiplexer 30 is directly supplied to output terminal 27 via bus 8. The output from multiplexer 30 is the signal appearing on bus 5 when test terminal T is set at logic "1". However, when terminal T is set at logic "0", the output from multiplexer 30 is the signal appearing on bus g3.

Assume that SMC A is completely independent of section B in response to the test signal. If T="0", then the signal on bus g3 from buffer 24 is extracted by multiplexer 30 and appears on bus 8. If T="1", the output on bus 5 from buffer 23 appears on bus 8 through bus 5a and multiplexer 30. Usually, the bus 5 and bus 5a may be of conductive films such as aluminum films interconnecting between the output of the buffer 23 and the input of the buffer 13 and the multiplexer 30. In this state, the signal appearing on bus 8 is monitored by a monitor connected to terminal 27 to accurately detect the propagation delay time and waveform of the signal appearing on bus 5. When signals on buses 3 and 8 are supplied to the control bus buffer in a commercially available equivalent of SMC A and only input data on bus 2 can be supplied to the data buffer therein, the SMC equivalent device can be operated in the same manner as built-in SMC A. An output level of the SMC equivalent device is compared with that of SMC A to easily check the SMC functions (emulation). In this case, an external signal T can be used as the test signal described above.

Signal T may also be prepared independently of the test signal. When signal T is set at logic "1", SMC A and section B are normally operated and all other terminals of the SI are set in the normal mode. The signal waveforms (logic level) and the propagation delay times of signals on bus 5 in the normal state can be monitored and accurately evaluated. In addition, the SMC equivalent device can be used to emulate the functions of built-in SMC A.

Figure 1:
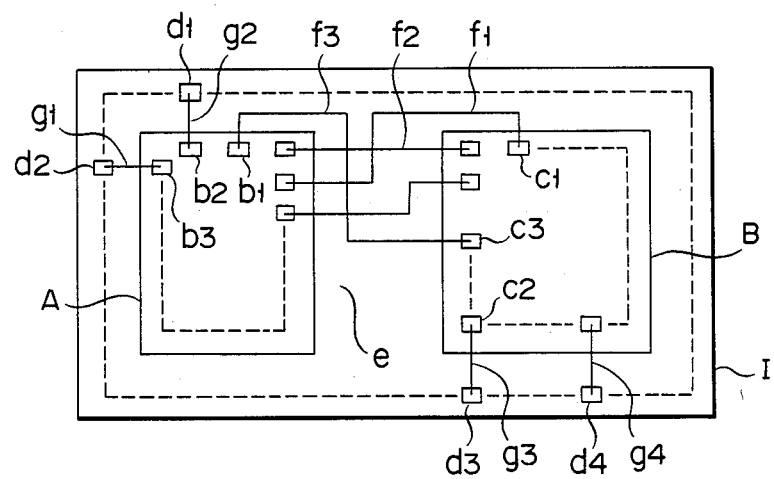
FIG. 1 is a block diagram of a conventional LSI device.
Figure 4:
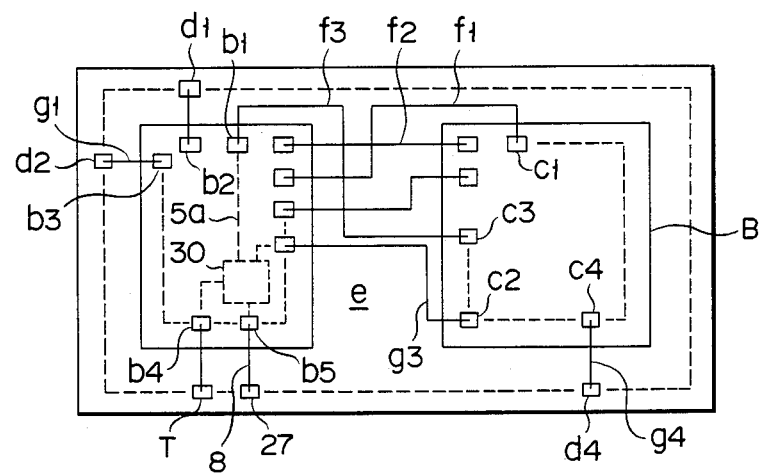
FIG. 4 is a plan view showing the device of FIG. 3 mounted on a single semiconductor substrate.

FIG. 4 is a schematic view of the device in FIG. 3. The same reference numerals in FIG. 4 denote the same parts as in FIG. 3. Referring to FIG. 4, SMC A and section B are separated by predetermined space e on single semiconductor substrate 40. It is convenient that multiplexer 30 is formed in SMC or section B as shown in FIG. 4. In section B, one input terminal of multiplexer 30 is connected to bonding pad b1 via bus 5a. One end of signal bus 5 is connected to pad b1 and the other end thereof is connected to pad c3 of section B. The other input terminal of multiplexer 30 is connected to output signal bus g3 from section B through pad b4. The control terminal of multiplexer 30 receives an external test signal supplied to terminal T. An output from the multiplexer 30 is supplied to output terminal 27 through output bus 8. When a probe of a tester is connected to terminal 27, the test signal is supplied to terminal T, thereby starting a test.

Figure 5:
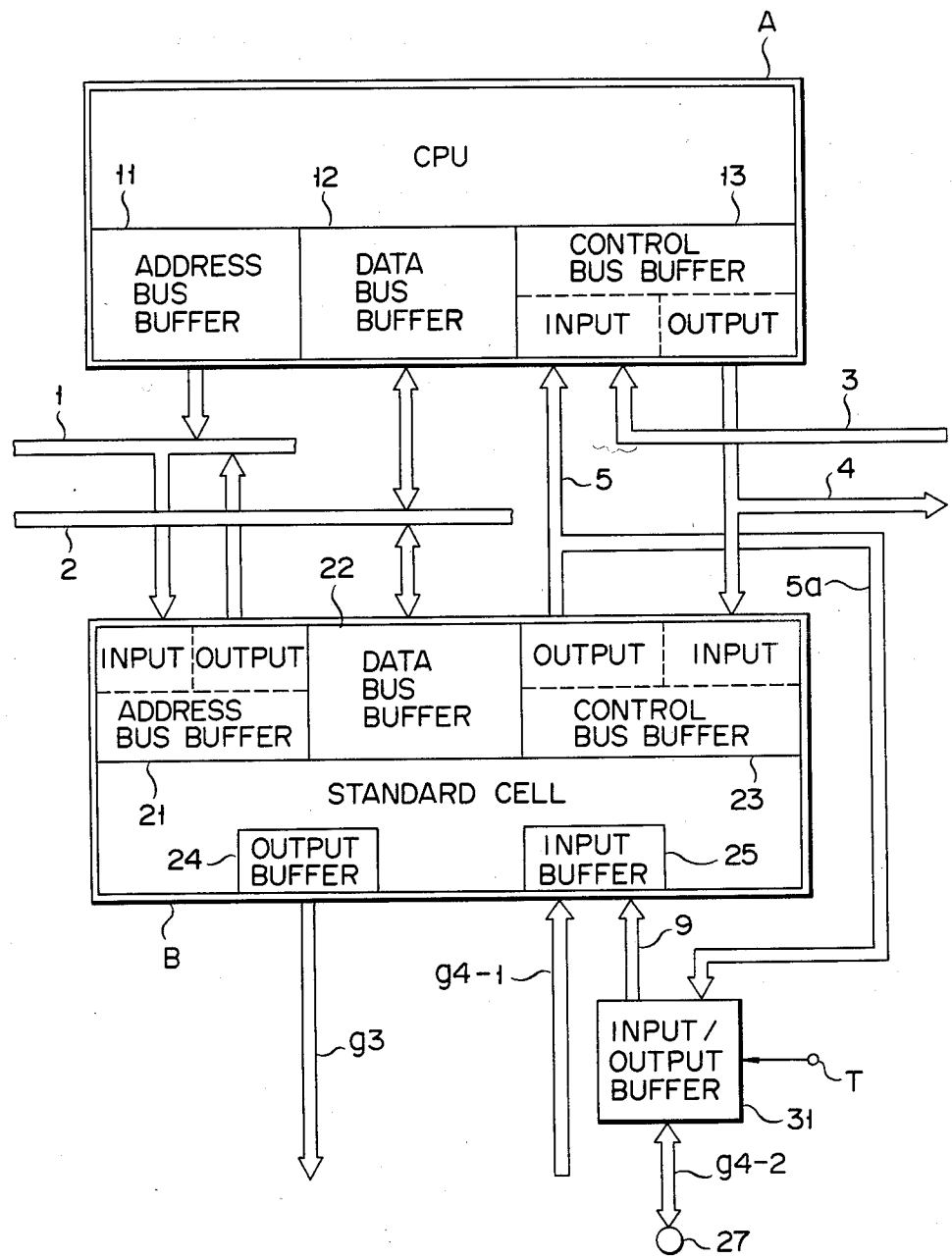
FIG. 5 is a block diagram of a super integration circuit device according to another embodiment of the present invention.

FIG. 5 and FIG. 6 show another embodiment of the present invention. In FIG. 5, external input bus g4 is divided into input bus g4-1, associated with outputs from control bus buffer 23, and input bus 9 not associated therewith. Buses 9, 5a and g4-2 are connected to buffer 31. If T="1", a signal on bus 5 appears on bus g4-2 through bus 5a and buffer 31. However, if T="0", the signal on bus g4-2 appears on bus 9.

In this case, buffer 31 is formed in space e as shown in FIG. 6 and the input signal is supplied to input buses g4-1 and g4-2 and signals input thereto can be supplied to buffer 25 as shown in FIG. 5. Input signals from bus g4-2 are supplied to buffer 25 through bus 9. If T="0", the devices in FIGS. 3 and 5 operate identically. However, if T="1", the output on bus 5 is output externally through bus 5a and bus g4-2. The output signal is then monitored to obtain the same effect as in the previous embodiment.

The present invention is not limited to the particular embodiments described above. Various changes and modifications may be made within the spirit and scope of the invention. In the above embodiments, only one SMC is used. However, the present invention is applicable when a plurality of SMCs are used. Part of the signal from the second IC-chip equivalent region (section B) to the first IC-chip equivalent region A may be multiplexed and extracted externally.

According to the present invention as described above, the level and propagation delay time of a signal input to an SMC loop in the SI can be directly evaluated. In addition, a signal only appearing between the SMC loop in the SI can be extracted outside the chip. An SMC equivalent can be operated under the same condition as in the SMC built into the SI. The outputs from the SMC equivalent and the built-in SMC are compared with each other to accurately evaluate the built-in SMC. Additional circuits for achieving the above objects, such as a multiplexer and an input/output buffer, are very simple. The SI chip area can thus be minimized, and an inexpensive SI circuit device can be provided.

What is claimed is:

1. A super integration circuit device comprising:
    a single semiconductor substrate;
    at least one first IC-chip equivalent region and a second IC-chip equivalent region formed on said single semiconductor substrate, each region having input and output terminals, said second IC-chip equivalent region comprising a core having predetermined patterns and preevaluated functions;
    a control bus for conducting output control data from an output port of said second IC-chip equivalent region to an input port of said first IC-chip equivalent region, said control bus being formed on said single semiconductor substrate, and the output control data being set to be exclusively supplied from said second IC-chip equivalent region to said at least one first IC-chip equivalent region when in a normal mode;
    means for directly connecting each of said IC-chip equivalent regions to a circuit external of the super-integration circuit;
    means, responsive to an external signal, for extracting the output control data supplied from said output port of said second IC-chip equivalent region to said input port of said at least one first IC-chip equivalent region, said extracting means including an extracting control bus having an input end connected to said control bus and having an output end connected to said extracting means, the extracting control bus being formed on said single semiconductor substrate; and
    an external terminal provided on said single semiconductor substrate for providing said external signal and operatively connected to said extracting means for receiving said extracted output control data, such that all ports of said first and second IC chip equivalents regions are made available at said external terminals during a test mode.

2. A device according to claim 2, wherein said second IC-chip equivalent region further includes a second output port for delivering an output signal; and said extracting means includes a multiplexer for selectively outputting one of said output control data and said output signal in accordance with said external signal.

3. A device according to claim 2, wherein said multiplexer is formed in one of said first and second IC-chip equivalent regions.

4. A device according to claim 1, wherein said extracting means includes a bidirectional buffer which receives an input signal supplied from said external terminal and transmits said output control data to the external terminal in accordance with said external signal.

5. A device according to claim 1, wherein said external signal is a test signal.

6. A device according to claim 1, wherein said bidirectional buffer is formed in a space provided between said first and second IC-chip equivalent regions on said single semiconductor substrate.

7. A device according to claim 1, wherein said first IC-chip equivalent region includes a first control bus buffer having an input port; said second IC-chip equivalent region includes a second control bus buffer having an output port; and said control bus means includes a unidirectional control bus for exclusively conducting the output control data from said output port to said input port in the normal mode.

* * * * *